United States Patent [19]
Yamaguchi

[11] Patent Number: 5,923,190
[45] Date of Patent: Jul. 13, 1999

[54] PHASE DETECTOR HAVING A SAMPLING CIRCUIT

[75] Inventor: Junichiro Yamaguchi, Tokyo, Japan

[73] Assignee: Ando Electric Co., Ltd., Tokyo, Japan

[21] Appl. No.: 08/880,452

[22] Filed: Jun. 24, 1997

[30] Foreign Application Priority Data

Jun. 27, 1996 [JP] Japan .................................. 8-186747

[51] Int. Cl.$^6$ ................................................ H03D 13/00
[52] U.S. Cl. ................................ 327/12; 327/9; 327/43
[58] Field of Search ............................ 327/12, 2, 3, 7, 327/9, 10, 39, 42, 43, 218, 91, 93, 18, 20

[56] References Cited

U.S. PATENT DOCUMENTS

| | | | |
|---|---|---|---|
| 4,675,558 | 6/1987 | Serrone et al. | 327/41 |
| 4,959,617 | 9/1990 | Martin | 327/12 |
| 5,126,602 | 6/1992 | Lee et al. | 327/10 |
| 5,530,383 | 6/1996 | May | 327/39 |

*Primary Examiner*—Kenneth B. Wells
*Assistant Examiner*—Hai L. Nguyen
*Attorney, Agent, or Firm*—Flynn, Thiel, Boutell & Tanis, P.C.

[57] ABSTRACT

A phase detector enables sampling of an input waveform such that a resolution, equivalent to the resolution conventionally obtained by doubling a clock frequency, is obtained without doubling the frequency. In order to accomplish this, the phase detector has the following construction and function. A first sampling circuit samples an input waveform using an in-phase clock signal from a clock to generate a sampled waveform. A second sampling circuit samples the input waveform by using a falling edge of the clock to generate an output a signal. A third sampling circuit samples the output signal from the second sampling circuit by a rising edge of the sampled waveform supplied from the first sampling circuit to generate a phase detection flag. This phase detection flag thus detects the presence of the input waveform at a rate double the frequency of the clock.

9 Claims, 1 Drawing Sheet

{ H:DELAY OF f / 2 IS PRESENT
  L: DELAY OF f / 2 IS ABSENT }

⇑ DELAY OF HALF PERIOD IS ABSENT

⇑ DELAY OF HALF PERIOD IS PRESENT

PHASE DETECTOR HAVING A SAMPLING CIRCUIT

BACKGROUND OF THE INVENTION

1. Field of the Invention

The present invention relates to a phase detector capable of doubling the resolution compared to a conventional sampling circuit, in which a first sampling circuit samples an input waveform by an input clock of a specific period to produce a first sampled waveform, a second sampling circuit samples the input waveform by a clock having a reverse phase to the input clock to produce a second sampled waveform, and a third sampling circuit samples the second sampled waveform by the first sampled waveform as a sampling clock.

2. Description of the Related Art

In the PCM communication system, input signals to be transmitted are sampled so as to convert the input signals into pulse amplitude modulation waves.

FIG. 3 is a block diagram showing an example of a conventional sampling circuit for performing such a sampling. In the example shown in FIG. 3, a D-type flip-flop (hereinafter, referred to as FF) is used for a sampling circuit.

In FIG. 3, an input waveform 1 enters an input terminal D of a FF 4, and a clock 2 of a specific period enters a clock input terminal CK of the FF 4. Thereby, the input waveform 1 is sampled to produce a sampled waveform 3 at an output terminal Q of the FF 4.

However, in the conventional sampling circuit, to enhance the resolution of the sampled waveform 3 needs to use a higher clock frequency for the clock 2, and to achieve a half resolution needs to double the frequency of the clock 2.

SUMMARY OF THE INVENTION

The present invention has been made to solve the foregoing problem, and an object of the present invention is to provide a phase detector that enables a sampling with a double resolution that can normally be achieved by doubling a clock frequency without doubling it.

In order to accomplish the foregoing object, a phase detector according to the present invention comprises (refer to FIG. 1): a first sampling circuit 14 for sampling an input waveform 11 by a clock 12 of a specific period, a second sampling circuit 15 for sampling the input waveform 11 by a clock 12b having a reverse phase to the clock 12, and a third sampling circuit 16 for sampling an output signal 18 from the second sampling circuit 15 by an output signal from the first sampling circuit 14 to produce a phase detection flag 17.

DESCRIPTION OF THE PREFERRED EMBODIMENT

Figure 1:
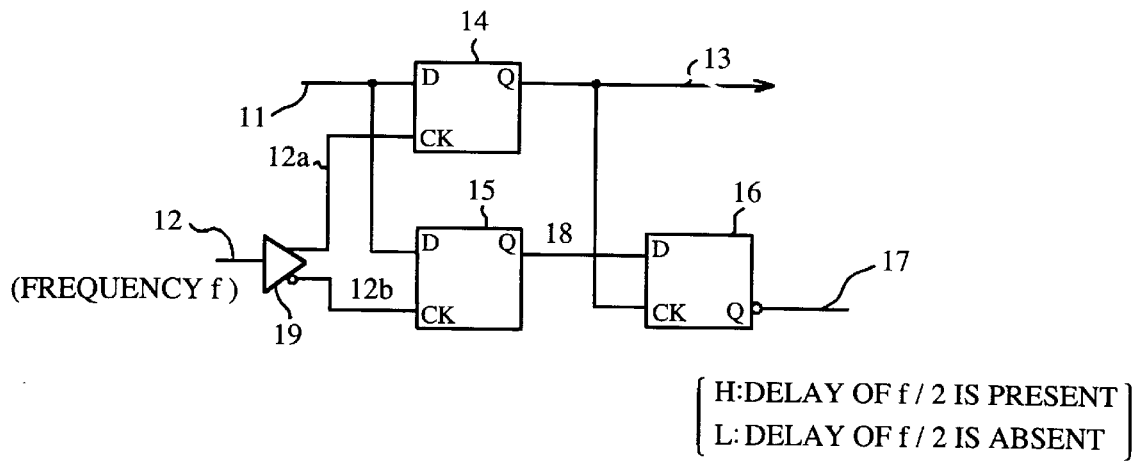
FIG. 1 is a block diagram showing a construction of one embodiment of a phase detector according to the invention.
Figure 2:
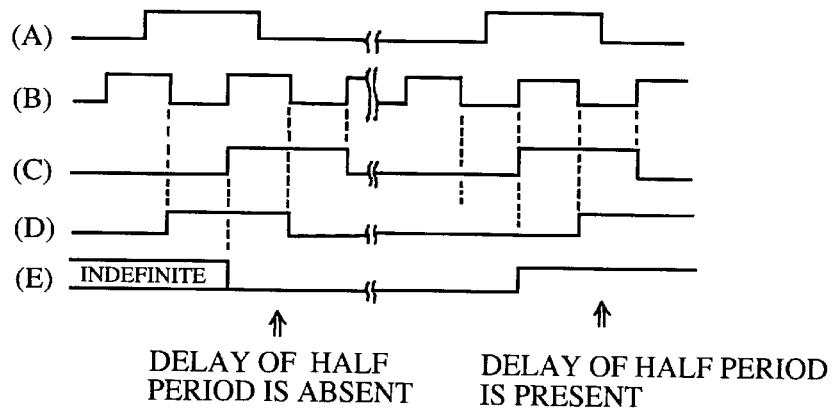
FIG. 2 is a timing chart for explaining an operation of the phase detector shown in FIG. 1.
Figure 3:
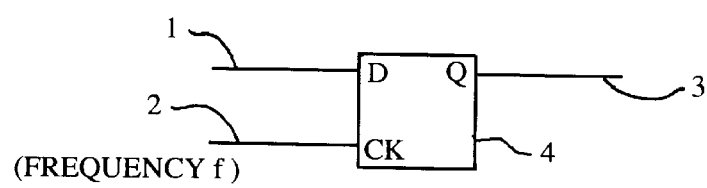
FIG. 3 is a block diagram showing an example of a conventional sampling circuit.

Preferred embodiments of the present invention will hereafter be described with reference to the accompanying drawings (FIG. 1 and FIG. 2).

According to a phase detector of this invention, an input waveform 11 enters a first sampling circuit 14 to be sampled by a clock 12 of a specific period, producing a sampled waveform 13. The input waveform 11 also enters a second sampling circuit 15 to be sampled by a clock 12b having a reverse phase to the clock 12, producing an output signal 18. The output signal 18 enters a third sampling circuit 16 to be sampled by the sampled waveform 13 being the output from the first sampling circuit 14 as a clock, thus producing a phase detection flag 17.

Next, the phase detector of the embodiment according to the present invention will be described in detail with reference to FIG. 1 and 2. FIG. 1 is a block diagram showing a construction of one embodiment of a phase detector according to the invention. In FIG. 1, the first through the third sampling circuits 14 through 16 each employ the D-type flip-flops in an example.

The input waveform 11 enters each of input terminals D of the first and second sampling circuits 14 and 15. The clock 12a in-phase with the clock 12 of a specific frequency f enters a clock input terminal CK of the first sampling circuit 14, in which the input waveform 11 is sampled by this clock 12a. The first sampling circuit 14 samples the input waveform 11 by this clock 12a.

A clock 12b having a reverse phase to the clock 12, produced by inverting a phase of the clock 12 by an inverter 19 enters a clock input terminal CK of the second sampling circuit 15, in which the input waveform 11 is sampled by the clock 12b of a reverse phase to the clock 12.

The output signal 18 from the second sampling circuit 15 enters an input terminal D of the third sampling circuit 16. The sampled waveform 13 supplied from an output terminal Q of the first sampling circuit 14 enters a clock input terminal CK of the third sampling circuit 16.

The third sampling circuit 16 samples the output signal 18 from the second sampling circuit 15 by using the sampled waveform 13 from the first sampling circuit 14 as a sampling clock to produce the phase detection flag 17.

Next, the circuit operation of the embodiment thus constructed will be described with reference to the timing chart shown in FIG. 2. First, the input waveform 11 as shown in FIG. 2(a) enters each of the input terminals D of the first and second sampling circuits 14 and 15, and the clock 12a in-phase with the clock 12 as shown in FIG. 2(b) enters the clock input terminal CK of the first sampling clock 14.

Thereby, the first sampling circuit 14 samples the input waveform 11 by the clock 12a to produce the sampled waveform 13 as shown in FIG. 2(c). This sampled waveform 13 enters the clock input terminal CK of the third sampling circuit 16 as a sampling clock.

Further, simultaneously with the sampling operation by the first sampling circuit 14, the second sampling circuit 15 receives at the clock input terminal CK thereof the clock 12b of a reverse phase to the clock 12a, namely, a phase produced by inverting the phase of the clock 12 by the inverter 19.

Accordingly, the second sampling circuit 15 samples the input waveform 11 by the clock 12b to send out the output signal 18 as shown in FIG. 2(d) to the input terminal D of the third sampling circuit 16.

The third sampling circuit 16 samples the output signal 18 as an input signal by the sampled waveform 13 as a sampling clock to produce a sampled waveform as shown in FIG. 2(e), which is used as the phase detection flag 17.

In the embodiment that performs such a sampling operation, the first and second sampling circuits 14 and 15 each perform samplings by each of the rising edges of the clock 12a and 12b. If the third sampling circuit 16 performs a sampling by a rising edge of the sampled waveform 13, since the clock 12a and 12b are in reverse phase, the second sampling circuit 15 equivalently performs a sampling by a falling edge of the clock 12.

The output signal 18 in FIG. 2(*d*) from the second sampling circuit 15 is sampled by a rising edge of the sampled waveform 13 in the third sampling circuit 16.

Therefore, the phase detection flag 17 produced by the third sampling circuit 16 detects the presence of the input waveform 11 by a falling edge of the clock 12a directly before the input waveform 11 is sampled in the first sampling circuit 14 by the clock 12 shown in FIG. 2(*b*), namely, the clock 12a.

In this case, if the duty of the clock 12 is one to one, the presence of the input waveform 11 will be detected before a half period of the clock 12. That is, the phase detection flag 17 can be used as a bit for a resolution obtained by a half period.

Preferably, the duty of the clock 12 is one to one. Especially, when the input waveform 11 is asynchronous to the clock 12, the accuracy is increased.

However, when the input waveform 11 is in a certain synchronous relation with the clock 12, for example, when a signal sampled by a double frequency of the clock 12 is used for the input waveform 11, the duty is not needed to be one to one. In such a case, the duty may be varied in such a manner that a difference by a half period of the clock 12 is produced as the phase detection flag 17.

Further, in the description of the foregoing embodiment, the sampling circuits 14 through 16 are D-type FFs, however, the invention is not limited to the D-type FFs as for the sampling circuits 14, 15. If a pulse width of the input waveform is more than one period of the clock 12, for example, latch circuits may be used for the sampling circuits 14, 15 instead of the D-type FFs.

According to a phase detector of the invention, the first sampling circuit samples an input waveform by a clock in-phase with an input clock to produce a sampled waveform, the second sampling circuit samples the input waveform by a clock of a reverse phase to the input clock, and the third sampling circuit samples an output signal from the second sampling circuit by a sampled waveform produced by the first sampling circuit, thus producing a phase detection flag. Therefore, it becomes possible to detect whether or not the input waveform is delayed by a half period of the clock. Although the resolution normally becomes (1/frequency) in case an input waveform is sampled by a specific frequency, the resolution in this invention can be enhanced to half of the abovementioned resolution (1/frequency).

What is claimed is:

1. A phase detector comprising:

a first sampling circuit for sampling an input waveform by a clock of a specific period;

a second sampling circuit for sampling said input waveform by a clock of a phase reverse to that of said clock; and a third sampling circuit for sampling an output signal from the second sampling circuit by an output from the first sampling circuit to produce a phase detection flag.

2. A phase detector comprising:

a first sampling circuit for sampling an input waveform by a clock of a specific period;

a second sampling circuit for sampling said input waveform by a clock of a phase reverse to that of said clock;

a third sampling circuit for sampling an output signal from the second sampling circuit by an output from the first sampling circuit to produce a phase detection flag; and the first through the third sampling circuits each are D-type flip-flops.

3. A phase detector as claimed in claim 1, wherein the first and the second sampling circuits each are latch circuits.

4. A phase detector as claimed in claim 1, wherein the third sampling circuit is a D-type flip-flop.

5. A phase detector comprising:

a first sampling circuit for sampling an input waveform using a clock having a specific period;

a second sampling circuit for sampling said input waveform by inverting a signal from said clock; and a third sampling circuit using an output from said first sampling circuit for sampling an output signal from said second sampling circuit to produce a phase detection output.

6. A phase detector as claimed in claim 5, wherein said inverted signal of said second sampling circuit has a phase inverse to that of said clock of said first sampling circuit.

7. A phase detector as claimed in claim 5, wherein said third sampling circuit is a D-type flip-flop.

8. A phase detector as claimed in claim 5, wherein said first through said third sampling circuits each are D-type flip-flops.

9. A phase detector as claimed in claim 5, wherein said first and said second sampling circuits are each latch circuits.

* * * * *